United States Patent [19]

Wallbillich et al.

[11] Patent Number: 4,871,650

[45] Date of Patent: Oct. 3, 1989

[54] COATING PLATE CYLINDERS OR SLEEVES WITH A CONTINUOUS, SEAMLESS PHOTOSENSITIVE LAYER

[75] Inventors: Guenter Wallbillich, Neustadt, Fed. Rep. of Germany; Jan H. Van Heuvelen, Losser, Netherlands

[73] Assignee: BASF Aktiengesellschaft, Ludwigshafen, Fed. Rep. of Germany

[21] Appl. No.: 153,936

[22] Filed: Feb. 9, 1988

[30] Foreign Application Priority Data

Feb. 14, 1987 [DE] Fed. Rep. of Germany ....... 3704695

[51] Int. Cl.4 ............................................... G03F 7/18
[52] U.S. Cl. ................................. 430/300; 430/270; 430/306; 430/307; 430/935
[58] Field of Search ............... 430/270, 273, 300, 306, 430/307, 935, 302, 275, 278

[56] References Cited

U.S. PATENT DOCUMENTS

| | | | |
|---|---|---|---|
| 2,993,789 | 7/1961 | Crawford | 430/281 |
| 4,104,072 | 8/1978 | Golda et al. | 430/302 |
| 4,233,390 | 11/1980 | Jargiello | 430/156 |
| 4,266,007 | 5/1981 | Hughes et al. | 430/306 |
| 4,337,220 | 6/1982 | Arimatsu | 264/51 |
| 4,349,620 | 9/1982 | Cyr et al. | 430/259 |
| 4,601,928 | 7/1986 | van der Velden | 428/36 |

FOREIGN PATENT DOCUMENTS

| | | |
|---|---|---|
| 0040893 | 12/1981 | European Pat. Off. . |
| 0043623 | 1/1982 | European Pat. Off. . |
| 0111371 | 6/1984 | European Pat. Off. . |
| 2391072 | 12/1978 | France . |
| 8501052 | 11/1986 | Netherlands . |
| 1579817 | 11/1980 | United Kingdom . |

OTHER PUBLICATIONS

Chem Abstract 95:131165f.
Chem Abstract 95:71071w.

*Primary Examiner*—José G. Dees
*Attorney, Agent, or Firm*—Keil & Weinkauf

[57] ABSTRACT

For coating printing cylinders or sleeves with a seamless, smooth photosensitive layer, two or more strata of a thin, prefabricated, essentially solvent-free, unsupported, thermoplastically processible, solid, photosensitive layer are applied to the printing cylinder or the sleeve, without bubbles and with displacement of the air between the individual strata, and the total photosensitive layer material is then heated under pressure and with joining or fusion of the individual strata to form a single, continuous photosensitive layer, and the surface of the resulting photosensitive layer is aftertreated to shape it exactly to size and is smoothed, with formation of an exactly cylindrical shape.

8 Claims, No Drawings

COATING PLATE CYLINDERS OR SLEEVES WITH A CONTINUOUS, SEAMLESS PHOTOSENSITIVE LAYER

The present invention relates to a process for coating plate cylinders or sleeves by applying a pre-fabricated, solid, thermoplastically processable photosensitive layer to the plate cylinder or the sleeve with formation of a continuous, seamless photosensitive layer under the influence of heat and pressure.

The production of printing plates by means of photosensitive layers is known per se. The photosensitive recording layers conventionally used for this purpose are generally photopolymerizable and/or photocrosslinkable and as a rule contain, in addition to a polymeric binder, one or more photopolymerizable and/or photocrosslinkable compounds, a photoinitiator and further additives and/or assistants. Because they are easy to process, thermoplastically processible photosensitive layers are frequently used for this purpose. For the production of the printing plates, the photosensitive recording layers firmly applied to a dimensionally stable support are exposed imagewise to actinic light and then developed in a suitable manner, for example by washing out with a developer. Depending on whether the photosensitive layer is negative-working or positive-working, the unexposed or exposed parts of the layer are removed during development of the printing plates.

For rotary printing, printing cylinders or sleeves are used and, for the production of continuous prints, it is necessary for the printing layer to have a continuous print image without gaps. If it is intended to produce such a printing cylinder or sleeve using the photosensitive recording materials now conventionally used for the production of printing plates, it is necessary to coat a printing cylinder or a sleeve, which is subsequently pushed onto an appropriate printing cylinder for printing, with a continuous, seamless photosensitive layer. Solution coating already proposed for this purpose is involved, very time-consuming and difficult to carry out, particularly if it is necessary to apply uniform thick photosensitive layers to the printing cylinder or the sleeve.

It has also been proposed that a stratum of a prefabrication, solid, thermoplastically processible photosensitive layer be wrapped around a printing cylinder or a sleeve, the edges of the end sections of the photosensitive layer abutting one another and forming a seam after the wrapping procedure. Printing cylinders or sleeves coated in this manner cannot be used directly for the production of printing plates for web-fed rotary printing presses but require appropriate joining of the abutting edges of the photosensitive layer at the seam or seams in order to produce a continuous, seamless, photosensitive layer on the plate cylinder or the sleeve. It is known that the abutting edges of thermoplastically processible photosensitive layers wrapped around plate cylinders or sleeves can be seamlessly joined by welding the abutting edges under the influence of heat and pressure. The relevant prior art is, for example, DE-A-27 22 896, DE-A-28 44 426, DE-A-28 42 440, DE-A-29 11 908, EP-B-40 893, EP-A-43 623 and EP-A-111 371.

In addition to the requirement that the photosensitive layers must be trimmed exactly to the circumference of the plate cylinders or sleeves to be coated, the last-mentioned procedure has the further disadvantage that the weld seam formed is frequently weak and not very stable to mechanical loads. A mechanical aftertreatment to shape the photosensitive layers welded by the known processes, for example by turning, cutting or the like, as is necessary in general for forming an exactly cylindrical surface, particularly where conical sleeves are used, is therefore difficult or impossible. Furthermore, these known processes can only be used to process thick prefabricated photosensitive layers whose thickness, moreover, must be matched with the final desired thickness of the coating. To tailor the thickness of the printing layer of the rotary printing cylinder thus produced to changing printing requirements, it is therefore necessary to have a stock of different prefabricated photosensitive layers of different appropriate thicknesses. The known processes for coating a plate cylinder or a sleeve with a continuous, seamless uniform photosensitive layer are therefore expensive and not very flexible.

It is an object of the present invention to provide a process for coating a plate cylinder or a sleeve with a continuous seamless uniform photosensitive layer by applying a prefabricated, solid photosensitive layer, which is easy to carry out, flexible and widely applicable, permits the thickness of the applied layer to be varied in a simple manner and ensures substantial freedom of choice in the type and shape of the prefabricated photosensitive layers to be used. The printing cylinders or sleeves coated with the continuous, seamless photosensitive layer by this process should be capable of being converted in a conventional manner, by imagewise exposure to actinic light and development, to printing plates which are suitable for rotary printing, in particular continuous printing, and give good printed copies. The process should in particular permit the use of conical sleeves without restrictions.

We have found, surprisingly, that this object is achieved by a process of the type under discussion, in which a thin, essentially solvent-free, unsupported, prefabricated, solid, thermoplastically processable photosensitive layer is applied to the printing cylinder or the sleeve in two or more strata without bubbles and with displacement of the air between the individual strata, after which the total photosensitive layer material applied is heated under pressure and with joining or fusion of the individual strata, and the continuously joined photosensitive layer produced on the printing cylinder or sleeve in this manner is then aftertreated to shape it to the exact size and is smoothed, with formation of an exactly cylindrical surface.

The present invention accordingly related to a process for coating a printing cylinder or a sleeve with a continuous seamless photosensitive layer by firmly applying a prefabricated, solid, thermoplastically processible photosensitive layer to the printing cylinder or the sleeve under the influence of heat and pressure, wherein the said photosensitive layer is a thin, essentially solvent-free, unsupported photosensitive layer which is applied to the printing cylinder or the sleeve in two or more strata lying one on top of the other, without bubbles and with displacement of the air between the individual strata, after which the total photosensitive layer material applied is heated under pressure and with joining or fusion of the individual strata, and the continuously joined photosensitive layer produced on the printing cylinder or the sleeve in this manner is then aftertreated to shape it to the exact size and is smoothed, with formation of an exactly cylindrical surface.

The novel process can be used to coat printing cylinders or sleeves by a simple procedure with a continuous, seamless, smooth photosensitive layer whose thickness can be varied and hence readily tailored to the changing printing requirements. Because of the many possible embodiments, the process according to the invention is widely and generally applicable. The continuously joined photosensitive layer applied to the printing cylinder or the sleeve is mechanically stable, can withstand mechanical loads and can be converted to printing plates in a conventional manner. Another advantage of the novel process is that there is no need for the prefabricated, thermoplastically processible photosensitive layers, with which the printing cylinders or sleeves are coated, to be cut exactly to size, and the novel process thus permits substantial freedom with regard to the prefabricated photosensitive layers to be used.

For the purposes of the present invention, photosensitive layers are in particular photosensitive recording layers.

Any thermoplastically processible, solid photosensitive layers which can be joined or fused to one another under the influence of heat and pressure without their photosensitive properties being adversely affected are suitable for use in the novel process. These include, in particular, the solid, polymeric photosensitive layers which soften on heating and flow or stick under pressure, as known per se for the production of printing plates. In addition to photodegradable systems, particular examples here are the positive-working or negative-working, photosensitive, photopolymerizable layers. Suitable photopolymerizable layers contain in general one or more thermoplastically processible polymeric binders, for example soluble nylons, partially hydrolysed polyvinyl acetates, plasticized polyvinyl alcohols or polyvinyl alcohol derivatives, polyurethanes, diene polymers, for example block copolymers of styrene, butadiene and/or isoprene or butadiene/acrylonitrile copolymers, one or more low molecular weight, ethylenically unsaturated, photopolymerizable compounds, for example the known monomers containing (meth)acrylate or (meth)acrylamido groups, one or more photopolymerization initiators, for example benzoin ethers, benzil monoketals or acylphosphine oxides, and conventional additives and/or assistants, for example thermal polymerization inhibitors, dyes, pigments, fillers, plasticizers, leveling agents, sensitometric regulators, etc. The photosensitive, photopolymerizable layers as known and described for the production of letterpress printing plates, including flexographic printing plates, or gravure printing plates, are particularly suitable for the novel process (cf. for example DE-A-22 15 090, DE-A-29 02 412, EP-B-27 612, DE-A-20 61 287, EP-A-70 510, EP-A-70 511).

The prefabricated, thermoplastically processible photosensitive layers to be used according to the invention are thin in comparison with the total thickness of the photosensitive layer which the printing cylinder or the sleeve should possess after coating. The thickness of the prefabricated photosensitive layers employed depends not only on the total thickness desired after coating but also on the number of strata, of these prefabricated, thin photosensitive layers, which are to be applied to the printing cylinder or the sleeve. Usually, the thickness of the said layers is from about 20 $\mu$m to about 2 mm, preferably from about 30 pm to 1,000 $\mu$m. The thinner layers permit greater flexibility of the process according to the invention.

The prefabricated, thermoplastically processible photosensitive layers to be used in the novel process should be free of solvents and of a support. For the purposes of the present invention, solvent-free means that the said layers should not contain any substantial amount of solvent, for example from their preparation. Nevertheless, they may contain a small residual amount of solvent, for example less than 5, in particular less than 2, by weight, based on the prefabricated photosensitive layer. What is important is that the solvent content of the said layers is so small that they do not form a gas under the processing conditions in the novel process. Advantageously, therefore, prefabricated photosensitive layers which have been prepared in the absence of a solvent by kneading, extrusion, calendering, pressing, etc. are used as starting materials for the novel process.

To permit firm fusion or bonding of the individual strata of the prefabricated photosensitive layer, which lie one on top of the other, in the novel process with formation of a single thick continuous photosensitive layer, it is of course necessary for the prefabricated photosensitive layers used according to the invention to be free of a support. Hence, it is preferable, but not essential, to use self-supporting prefabricated photosensitive layers in the novel process. It is also possible for the photosensitive layers used first to be applied to a temporary support, for example a plastic film, which is then removed immediately before the said layers are used in the novel process, for example by peeling off.

The cylinders or sleeves conventionally used for the production of rotary printing plates, in particular the conical sleeves, are suitable for the printing cylinders or sleeves which are to be coated according to the invention with the photosensitive layers. While the printing cylinder usually consists of metal, the sleeves may be composed of metal, plastics, glass fiber-reinforced plastics or the like. The surface of the cylinders or sleeves may be smooth or rough or structured, for example to achieve better adhesion of the photosensitive layer. The surface of the printing cylinders or of the sleeves may also be provided with a mixture of adhesion-promoting compounds, an adhesion-promoting layer, a hot-melt adhesive or the like, in order to achieve good adhesion to the photosensitive layer. Fixing of the lower stratum of the prefabricated photosensitive layer to the printing cylinder or the sleeve can also be effected, for example, by means of a double-sided self-adhesive tape. The printing cylinders and sleeves can also be covered with, for example, a plastic or rubber layer. In a preferred embodiment of the novel process, sleeves are covered with a knitted textile fabric before being coated with the photosensitive layer.

The prefabricated, thermoplastically processible, solid, thin photosensitive layers to be used in the novel process can have any desired shape, so that exact trimming to size is not required. Preferably, the said layers are rectangular or in the shape of a parallelogram and as a rule are sheet-like, web-like or belt-like. In a particular embodiment of the novel process, the prefabricated photosensitive to sensitive layers used are those whose end areas, which are generally parallel to the axis when the photosensitive layers are placed on the printing cylinder or the sleeve, are flattened, in particular wedge-shaped. It has proven particularly advantageous if the end edges of the lower stratum or strata of the prefabricated, photosensitive layers placed one on top of the other are wedge-shaped, in particular in such a way that the wedge-shaped bevel is directed downward and away from the particular stratum on top.

The printing cylinders or sleeves can be covered with a plurality of strata of the prefabricated, thin photosensitive layers by several methods. In one embodiment of the novel process, this is done by wrapping a prefabricated, web-like, thin photosensitive layer several times, but not less than twice, around the plate cylinder or the sleeve. The number of windings corresponds to the number of strata. Of course, for wrapping the plate cylinder or the sleeve, it is possible not only to use a prefabricated, web-like, thin photosensitive layer but also to wrap the said cylinder or sleeve with two or more of the said layers in a plurality of strata. In this embodiment, it is furthermore not necessary for the wrapping procedure to form exactly 2, 3, 4 etc. strata, ie. for the end edges of the prefabricated web-like photosensitive layer or photosensitive layers, which edges are parallel to the axis, to come to rest exactly one on top of the other at the beginning and at the end of the winding. It is quite possible for the final winding to cover only part of the cylinder surface, ie. for this final stratum to be incomplete. According to the invention, all that is required is that the printing cylinder or the sleeve is covered with two or more, preferably three or more, complete strata of the said layer.

In another embodiment of the novel process, the printing cylinder or the sleeve can be wrapped spirally with a web-like or belt-like, prefabricated, thin photosensitive layer in a plurality of strata. In this case, the spiral windings of the individual strata can run in the same direction or in opposite directions. Furthermore, the said layer can be wound spirally in such way that, in each individual stratum, the edge or lateral areas of the thin prefabricated photosensitive layer overlap or abut one another. If the printing cylinders or sleeves are wrapped spirally with thin, prefabricated photosensitive layers in such a way that the edge or lateral areas of the said layers overlap one another in the individual strata, it is advantageous if the subsequent stratum is wound in the opposite direction to the preceding stratum. If winding is carried out in the same direction, it is advantageous slightly to stagger the said layers with respect to one another in the individual strata so that the overlapping edge or lateral areas of two strata arranged directly one on top of the other do not come to rest one on top of the other. In the case of winding with overlap, the overlap area is less than 50%, preferably not more than 25%, in particular up to 15%, of the width of the web-like or belt-like, prefabricated, thin photosensitive layer. In practice, it has proven advantageous if, when winding is carried out with overlap, the edge or lateral areas of the said layer overlap by about 1–10 cm. If the said layers are wound spirally on the printing cylinders or sleeves in such a way that the edge or lateral areas of the said photosensitive layer abut one another, without overlap, in the individual, spirally wound strata, it is preferable if the resulting contact or seam lines in two strata directly one on top of the other do not coincide. In this case too, it is therefore advantageous if the relevant successive strata are wound spirally in opposite directions. It is of course also advantageous if the spiral winding is carried out in the same direction in the individual strata, but the web-like or belt-like, prefabricated, thin photosensitive layers are staggered laterally from stratum to stratum in such a way that the contact or seam lines of the individual strata do not come to rest one on top of the other but the contact or seam lines of one stratum are covered by the prefabricated, thin photosensitive layer of the next stratum arranged on top.

In yet another embodiment of the novel process, the plate cylinder or the sleeve can be covered with a plurality of strata of sheet-like, prefabricated, thin photosensitive layers, the length of which roughly corresponds to the circumference of the plate cylinder or of the sleeve. In this embodiment, the end and/or lateral areas of the said individual layers can be placed together so that they overlap or abut when the plate cylinder or the sleeve is being covered. In this case too, the overlap region in the end and/or lateral areas is as a rule less than 50%, preferably less than 25%, in particular not more than 15%, of the area of the sheet-like, prefabricated, thin photosensitive layers to be joined. In practice, it has proven advantageous and adequate if the end and/or lateral areas of the said layers overlap by about 1–10 cm. The individual strata are preferably laid so that the overlapping end and/or lateral areas of a stratum do not coincide with the overlapping end and/or lateral areas of the preceding and/or subsequent stratum. Furthermore, where the said layers are overlapped, it is advantageous if the end and/or lateral areas of these layers are made wedge-shaped in the overlap area. If the plate cylinders or sleeves are covered with the sheet-like, prefabricated, thin photosensitive layers in such a way that their end and/or lateral edges abut one another in the individual strata, it is advantageous to arrange the said layers in the subsequent stratum in such a way that the abutting edges of the stratum directly underneath are covered as completely as possible by the photosensitive layer above. When the plate cylinders or sleeves are covered in this manner too, the final stratum need not be complete, i.e. it may cover only part of the laterl surface of the plate cylinder or of the sleeve if not less than 2, preferably not less than 3, complete strata of the said layer have been applied to the plate cylinder or the sleeve beforehand.

Of course, combinations or other forms of the above-mentioned embodiments can also be used. What is important for the novel process is that coating of the printing cylinder or of the sleeve with the individual strata of the thin prefabricated photosensitive layer is carried out without bubbles and with displacement of the air between the individual strata on top of one another, and of course between the plate cylinder or the sleeve and the first stratum of the said layer. If end and/or lateral areas of the thin, prefabricated photosensitive layers are overlapped in a stratum, these overlap areas too should of course be free of bubbles and enclosed air. Bubble-free application of the individual strata of the said layers to the printing cylinder or the sleeve can be effected, for example, by appropriately pressing the said layer against the printing cylinder or the sleeve or against the particular lower stratum of the said layer with displacement of air, for example by means of a roll. In order to ensure that the upper stratum, of the photosensitive layer, to be applied in each case fits closely on the substrate, in particular in the region of overlaps of end and/or lateral areas of the prefabricated, thin air cavities, and to maintain such a fit, it may be advisable and useful if the abovementioned pressing procedure is carried out in the presence of a laminating assistant and/or, in particular, under the influence of heat. For example, a hot air blower can be used for this purpose. Where laminating assistants are concomitantly used, they are advantageously removed by mechanical displacement and/or by evaporation during the lamination process.

According to the invention, the printing cylin- photosensitive or sleeves are covered with two or more strata of a prefabricated, thin photosensitive layer. The maximum possible number of strata depends on the desired total thickness of the photosensitive layer and on the minimum thickness in which the said layers can be produced and processed according to the invention. In practice, it is usual to apply from 2 to about 20, in particular from 3 to 10, strata of the said layer to the printing cylinder or the sleeve.

For firm joining and fusion of the individual strata of the prefabricated, thin photosensitive layer which are applied without bubbles, and, depending on the coating method, of the end and/or lateral areas of this layer, the total photosensitive layer material is heated under the influence of pressure after coating of the printing cylinder or the sleeve, until a single, cohesive, continuously joined photosensitive layer has formed. The temperatures to be used for this purpose depend primarily on the thermal and rheological properties of the prefabricated, thin photosensitive layers used and are in general sufficiently high to cause the individual strata or the said layers, which strata lie one on top of the other, to fuse or flow into one another under the applied pressure, but not so high that the properties of the photosensitive layer are adversely affected as a result. Otherwise, the temperature are chosen so that joining and fusion of the individual strata of the said layer and, where relevant, of the end and/or lateral edges of the said layers take place in an appropriate time. Usually, temperatures of from about 40 to about 200° C., in particular from about 80 to 150° C., are used for this purpose. The layer material can be heated from the back, ie. from the side facing the printing cylinder or the sleeve, for example by means of heating elements arranged in the printing cylinder or in the sleeve. Electrical resistance heaters are particularly suitable for such heating elements. However, it is also possible to heat the layer material from the outer surface of the photosensitive layer, for example by means of infrared or microwave radiators, hot air blowers or the like. Of course, both methods of heating, ie. from the back and from the outer layer surface, can be carried out simultaneously.

The pressure acting on the layer surface during heating of the photosensitive layer material can be generated in any suitable manner. For example, a firm thrust element, a rotating nip roll or the like can be used for this purpose. The application of reduced pressure with extraction of air and any other gases present has proven particularly advantageous for pressure generation. This can be effected in a known manner, for example by providing the strata of the prefabricated, thin photosensitive layer, which are applied to the printing cylinder or the sleeve, with a gas-tight covering consisting of, for example, plastic film or shrink film, and evacuating, the printing cylinder or the sleeve preferably being provided with appropriate extraction orifices or surface channels permitting the extraction of gases, or the like. In this context, reference may be made to the prior art cited above. In a possible advantageous embodiment, the printing cylinder or the sleeve, which may be provided with an adhesion-promoting layer, is covered with a knitted textile fabric for this purpose. Before the strata of the said layer are applied on top, after which the coated printing cylinder or the coated sleeve is provided with a gas-tight covering by means of a plastic film and reduced pressure is then applied.

The time of the heat and pressure treatment essentially depends on the type of prefabricated, thin photosensitive layer used and on the process conditions and is usually from about 10 to 120 minutes.

Heating under the influence of pressure results in joining and fusion of the individual strata of the prefabricated, thin photosensitive layer which are arranged on the printing cylinder or the sleeve, and, depending on the type of coating method, also of the end and/or lateral areas of these photosensitive layers, with formation of a single, continuously joined photosensitive layer on the printing cylinder or the sleeve. Thereafter, as a rule after the photosensitive layer has been cooled, the surface of the resulting, joined, continuous photosensitive layer is subjected to an aftertreatment, in particular a mechanical one, to shape it to the exact size, in order to produce an exactly cylindrical surface on the printing cylinder coated in this manner or on the sleeve coated in this manner, as required for the production of rotary printing plates. The said aftertreatment is particularly important if conical sleeves have been coated, according to the invention, with a thin, prefabricated photosensitive layer. In this case, it is in fact necessary also to compensate the longitudinal axial decrease or increase in the diameter of the conical sleeve by the shaping aftertreatment, in order to obtain an exactly cylindrical surface on the sleeve covered with the photosensitive layer. The shaping aftertreatment can be carried out by any suitable method and is preferably effected by mechanical processing of the layer surface, for example turning, cutting, grinding or the like. Smoothing of the surface of the photosensitive layer aftertreated in this manner can be carried out by a conventional procedure, for example by a solvent treatment, calendering or the like. The shaping aftertreatment and smoothing may also include a suitable thermal treatment, for example hot calendering.

The novel process gives printing cylinders and sleeves which are coated with a continuous, seamless, smooth photosensitive layer and are very suitable for the production of rotary printing plates, in particular for flexographic or gravure printing. For the production of the printing plates, the photosensitive layer applied to the printing cylinder or to the sleeve is exposed imagewise to actinic light in a conventional manner and then developed, in particular by washing out with a developer. Development may, if desired, be followed by the conventional aftertreatment steps, for example postexposure, drying or another heat treatment. The printing cylinders or sleeves obtained by the novel process and covered with a continuous, seamless photosensitive layer can, before being used further, also be covered with a protective film, coating film, matt film or the like. The printing plates produced from the said printing cylinders or sleeves give excellent print results in rotary printing and can be used in particular, without problems, for continuous printing.

The Examples which follow illustrate the invention.

EXAMPLE 1

A cylindrical nickel sleeve provided with a mixture of adhesion-promoting components was wrapped with a 0.2 mm thick solvent-free and unsupported, web-like, photosensitive, photopolymerizable layer in such a way that the sleeve was covered without bubbles being present. The said layer was prepared according to Comparative Experiment A of EP-A-70 510. After the sleeve wrapped in the photosensitive layer had been covered with a gastight film and reduced pressure applied between the photosensitive layer and the sleeve, the total photosensitive layer was heated at 130° C. for about 30 minutes. Thereafter, the individual strata of the photosensitive layer found to be firmly joined to one another, and furthermore a firm bond resulted between the photosensitive layer and the nickel sleeve. After cooling and removal of the gas-tight film, the surface of the photosensitive layer was brought to the desired exactly cylindrical dimension by turning using a carbide tool. Finally, the layer surface was smoothed by polishing and hot calendering. A cylindrical sleeve having a seamless, smooth continuous photosensitive layer resulted. According to the process of Example 1 of EP-A-70 510, this sleeve could be converted by imagewise exposure to actinic light and development with a developer into a satisfactory printing plate for rotary gravure printing.

EXAMPLE 2

The procedure described in Example 1 was followed, except that in this case the web-like photosensitive layer, which was 0.15 mm thick, was wound on a slightly conical nickel sleeve. By heating with a hot air blower, it was ensured that the individual strata lay smoothly one on top of the other, without enclosed air, during the wrapping procedure. The surface of the conical nickel sleeve was once again provided beforehand with a mixture of adhesion-promoting components, but in this case, to facilitate evacuation, was additionally covered with a fine denier stocking of manmade fiber before covering with the photopolymerizable layer. The nickel sleeve was wrapped in four strata of the web-like photopolymerizable layer. After evacuation, heating, turning and smoothing as in Example 1, a single, continuous, smooth photosensitive layer having an exactly cylindrical surface was obtained, the said layer being firmly bonded to the nickel sleeve. The gravure printing plate produced therefrom gave excellent results in the printing process.

EXAMPLE 3

A 0.3 mm thick, web-like, photopolymerizable layer based on an alcohol-soluble nylon according to Example 1 of EP-A-46 047 was wound on a sleeve in the manner described in Example 1. In this case, however, the sleeve consisted of a phenol resin, and winding was carried out in such a way that a covering comprising two strata resulted. Furthermore, the end edges of the web-like photosensitive layer, which were parallel to the axis, were made wedge-shaped before winding on the sleeve. Otherwise, the procedure described in Example 1 was followed. In this case too, it was possible to produce a printing plate which gave excellent results in rotary letterpress printing.

EXAMPLE 4

A 0.4 mm thick, web-like, photopolymerizable layer according to Example 1 of DE-A-29 42 183 was wound around a nickel sleeve, provided with a mixture of adhesion-promoting components, in such a way that the nickel sleeve was covered with four strata of the photopolymerizable layer. Otherwise, the procedure described in Example 1 was followed. Polishing and calendering gave a sleeve which was covered with a continuous, smooth photosensitive layer having an exactly cylindrical surface and which was very suitable for the production of flexographic printing plates.

We claim:

1. A process for coating a printing cylinder or a sleeve with a continuous, seamless, photosensitive layer which comprises:

winding a prefabricated, thin, web-like, solid, thermoplastically processable, essentially solvent-free, unsupported photosensitive layer at least twice around the printing cylinder or sleeve without bubbles and with the displacement of the air between the individual strata to form two or more strata lying one on top of the other;

heating the total applied photosensitive layer material under pressure to bond the individual strata of the layer;

shaping the continuous and bonded photosensitive layer to form an exactly cylindrical surface, and smoothing the surface of the layer.

2. The process of claim 1, wherein the web-like layer is wound around the printing cylinder or the sleeve from 3 to 10 times.

3. The process of claim 1, wherein, for coating the printing cylinder or the sleeve, solventfree, prefabricated, thin, photosensitive layers which do not form a gas under the processing conditions are used.

4. The process of claim 1, wherein the photosensitive layer material applied in strata on the printing cylinder or the sleeve is heated at from about 80° to 150° C.

5. The process of claim 1, wherein the pressure is about 0.1–1 kg/cm$^2$.

6. The process of claim 1, wherein the printing cylinder or the sleeve has been provided with a mixture of adhesion-forming components or an adhesionpromoting layer prior to application of the photosensitive layer.

7. The process of claim 1, wherein heating of the photosensitive layer material is carried out under reduced pressure between the printing cylinder or sleeve and the photosensitive layer or a plastic film or shrink film covering the latter.

8. The process if claim 1 wherein the shaping aftertreatment is carried out mechanically by turning, cutting or grinding.

* * * * *